United States Patent [19]

Tonnu et al.

[11] Patent Number: 5,036,226
[45] Date of Patent: Jul. 30, 1991

[54] SIGNAL CONVERTING CIRCUIT

[75] Inventors: Thao T. Tonnu, Lemon Grove; Mukesh B. Suthar, Santa Clara; Charles A. Kaseff, San Diego, all of Calif.

[73] Assignee: NCR Corporation, Dayton, Ohio

[21] Appl. No.: 426,615

[22] Filed: Oct. 23, 1989

[51] Int. Cl.[5] ............... H03K 19/0175; H03K 19/20
[52] U.S. Cl. ...................................... 307/475; 307/455
[58] Field of Search ............... 307/475, 449, 455, 475, 307/451

[56] References Cited

U.S. PATENT DOCUMENTS

| 4,307,308 | 12/1981 | Sano | 307/475 |
|---|---|---|---|
| 4,563,601 | 1/1986 | Asano et al. | 307/475 |
| 4,574,273 | 3/1986 | Atsumi et al. | 307/475 |
| 4,578,601 | 3/1986 | McAlister et al. | 307/475 |
| 4,593,212 | 6/1986 | Svager | 307/475 |
| 4,835,419 | 5/1989 | Chappel et al. | 307/475 |
| 4,896,059 | 1/1990 | Goodwin-Johansson | 307/451 |
| 4,906,871 | 3/1990 | Iida | 307/475 |

Primary Examiner—David Hudspeth
Assistant Examiner—Andrew Sanders
Attorney, Agent, or Firm—Wilbert Hawk, Jr.; Stephen F. Jewett

[57] ABSTRACT

A converter circuit for converting signals from a non-CMOS circuit into signals for a CMOS circuit. A level shifter stage in the circuit has a first MOS transistor for receiving at its gate the non-CMOS signals which always enable the first transistor and a second MOS transistor for receiving at its gate a constant voltage for enabling the second transistor. Since these transistors do not switch between non-enabling and enabling conditions in order to change the logic levels at the output of the converter circuit, the circuit operates quickly. In one embodiment the converter circuit converts ECL signals into CMOS signals, and in a second embodiment the converter circuit converts TTL signals into CMOS signals.

11 Claims, 2 Drawing Sheets

SIGNAL CONVERTING CIRCUIT

BACKGROUND OF THE INVENTION

The present invention relates to signal converting circuits and, more particularly, to a circuit for converting logic signals represented by certain voltage levels (e.g., for an ECL circuit) into logic signals represented by a different voltage levels (e.g., for a CMOS circuit).

Computer systems today use circuits implemented in different hardware technology. For example, it is not uncommon to find in one computer both CMOS (complementary metal-oxide-semiconductor) and ECL (emitter-coupled logic) circuits. CMOS is often used in very large chips having many transistors (in excess of 100,000) because it requires relatively little power. Other smaller, but faster, chips are normally implemented in ECL.

One problem with having circuits in a single system implemented in different hardware technologies is that the same logic level of the signals from different circuits are represented by different voltages. For example, in an ECL circuit, a logic level "1" or "high" will typically be represented by approximately −0.8 V and a logic level "0" or "low" will typically be represented by approximately −1.6 V. A CMOS circuit, on the other hand, will typically have a logic level "1" represented by ground (0 V) and logic level "0" represented by −5.0 V. It thus becomes necessary to provide a signal converter or interface when the signals from an ECL circuit are provided to an CMOS circuit.

Circuits have been designed for converting ECL logic signals into CMOS logic signals. However, such circuits tend to delay the operation of the system in which they are used. That is, the signals going from the ECL circuit to the CMOS circuit must pass through the converting circuit (normally a plurality of P-channel and N-channel transistors) in order to be converted from one set of voltages to the other, and such conversion adds delay to the overall time for processing the signals.

This problem occurs because prior converter circuits have used MOS transistors at their inputs to sense the voltage level of the signals from the ECL circuit and then provide a signal capable of driving the CMOS buffers or drivers in the converter. These MOS transistors are switched between enabled ("on") and non-enabled ("off") conditions, requiring time to accommodate sufficient voltage swings (e.g., from 0 V to −5 V) across the drain-to-source junction in the transistors. This time adds to the overall delay of the systems in which the converter circuits are used.

There has thus arisen the need for a signal converter circuit which reduces the amount of time needed to convert logic signals represented by one set of voltages into the same logic signals represented by a different set of voltages.

SUMMARY OF THE INVENTION

There is provided, in accordance with the present invention, a converter circuit for converting a first set of logic signals into a second set of logic signals, the converter circuit including a first transistor of a first conductivity type and a second transistor of a second conductivity type. The first and second transistors each have first and second terminals and a control terminal. The control terminal of the first transistor is connected for receiving the first set of logic signals, the first set of logic signals each being at a voltage sufficient to enable the first transistor. The control terminal of the second transistor is connected to a voltage source, the voltage source providing a constant voltage for enabling the second transistor. Thus, both the first and second transistors remain enabled at all times (and do not go through relatively large voltage swings across their terminals during operation, as could be the case if they operated in both enabled and non-enabled conditions). One of the first and second terminals of the first transistor and one of the first and second terminals of the second transistor are connected to each other for providing signals representing the second set of logic signals.

In one described embodiment, the converter circuit converts signals from an ECL circuit into signals for a CMOS circuit. An N-channel MOS transistor receives the ECL signals at its gate terminal. The gate terminal of a P-channel MOS transistor is connected to a voltage source providing a "low" logic level for maintaining the P-channel in an enabled condition. The drain of the N-channel MOS transistor and source of the P-channel MOS transistor are connected together to provide the second set of logic signals which can drive a CMOS inverter.

In another described embodiment, a circuit is provided for converting signals from a TTL circuit into signals for a CMOS circuit.

It is therefore an object of the present invention to provide a new and improved circuit for converting signals from a non-CMOS circuit into signals for use in a CMOS circuit.

It is another object of the present invention to provide such a converter circuit having reduced time required for signal conversion.

It is yet another object of the present invention to provide a new and improved circuit for converting signals from an ECL circuit into signals for a CMOS circuit.

It is still a further object of the present invention to provide a new and improved circuit for converting signals from a TTL circuit into signals for a CMOS circuit.

These and other objects, features, and advantages of the present invention will become apparent from the following description and the attached drawings, wherein like reference numbers indicate like parts.

DETAILED DESCRIPTION OF THE PREFERRED EMBODIMENTS

Figure 1:
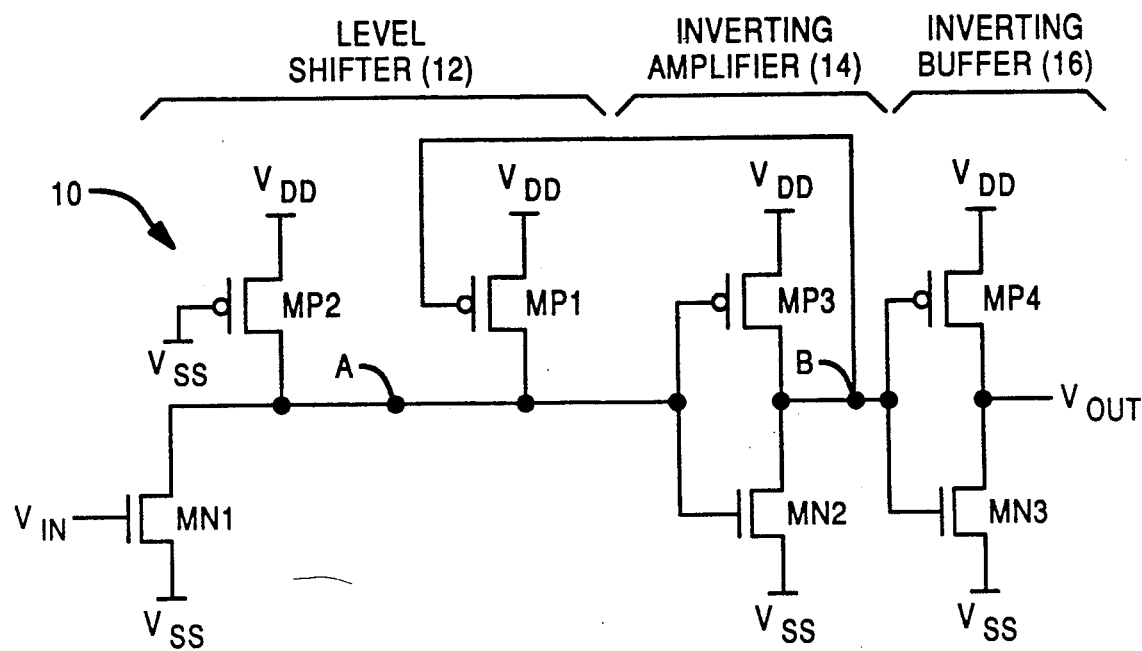
FIG. 1 is a circuit diagram of a converter circuit in accordance with the present invention.

Referring now to FIG. 1, there is seen a converter circuit 10 in accordance with the present invention. The circuit 10 has three stages, a LEVEL SHIFTER stage 12 consisting of MOS transistors MN1, MP2, and MP1, an INVERTING AMPLIFIER stage 14 in the form of a CMOS inverter consisting of transistors MN2 and MP3, and an INVERTING BUFFER stage 16 in the form of a second CMOS inverter consisting of transistors MN3 and MP4. The MOS transistors in the circuit 10 are conventionally designated, with each P-channel MOS transistor illustrated with a "bubble" at its gate terminal and each N-channel MOS transistor illustrated without such a "bubble".

The converter circuit 10 converts binary logic signals from an ECL circuit into corresponding binary logic signals for a CMOS circuit (but inverted). In the illustrated embodiment, the ECL signals are at approximately $-1.6$ V for logic level "0" or "low" and approximately $-0.8$ V for logic level "1" or "high". They are converted into CMOS signals at approximately $-5.0$ V for logic level "0" and approximately 0 V for logic level "1". The LEVEL SHIFTER 12 receives the ECL signals at the input $V_{IN}$ and converts them into CMOS signals at node A (at logic levels which are the inverse of the ECL signals, but at voltages that will drive a CMOS inverter). The INVERTING AMPLIFIER 14 takes the signals at node A and amplifies them so that at node B they are near the full voltage levels specified for CMOS signals. The INVERTING BUFFER 16 buffers the signals on node B so that the CMOS signals provided at the output $V_{OUT}$ are at full CMOS voltage levels, corresponding to the logic levels of the ECL signals at the input $V_{IN}$ (but inverted).

Figure 2:
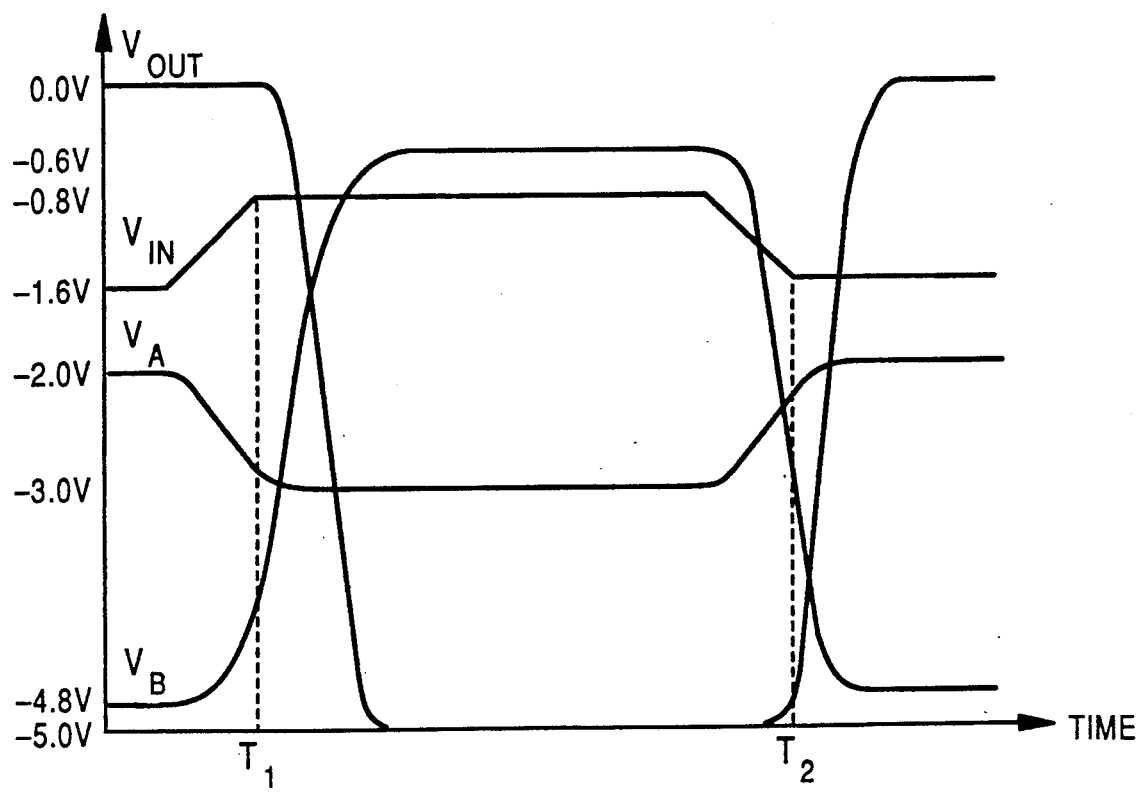
FIG. 2 is a timing diagram illustrating the signals in the converter circuit of FIG. 1.

The operation of the converter circuit 10 will now be described in greater detail, by reference to FIG. 2 in conjunction with FIG. 1. FIG. 2 illustrates the waveforms of the signals at input $V_{IN}$, node A, node B and output $V_{OUT}$.

The transistor MP2 is always enabled during operation of the circuit 10, since MP2 always receives an enabling voltage $V_{SS}$ ($-5.0$ V) at its gate. Likewise, the transistor MN1 is always enabled, since at its gate it receives only ECL signals (that are either $-0.8$ V or $-1.6$ V, both of which are sufficiently close to the "1" or "high" logic level required to operate the transistor MN1 in its linear region). When the input $V_{IN}$ goes to a logic level "1" at time $T_1$ (FIG. 2), the resistance across the transistor MN1 becomes very low. Node A is connected through transistor MN1 to the voltage source $V_{SS}$ ($-5.0$ V) and immediately drops to $-3.0$ volts. Although node A is also connected to the voltage source $V_{DD}$ (0 V) through the transistor MP2, the sizing of the transistors MN1 and MP2 is chosen so that the drain-to-source resistance of MN1 is considerably less than that of MP2 when both are enabled. Thus, the signal $V_A$ at node A is pulled closer to the voltage of $V_{SS}$ ($-5.0$ V) than the voltage of $V_{DD}$ (0 volts).

The INVERTING AMPLIFIER 14 consisting of transistors MP3 and MN2 amplifies (and inverts) $V_A$ into a signal ($V_B$) at node B that is almost the full "high" logic level (approximately $-0.5$ volts). The "high" at node B disables the transistor MP1 so that MP1 has no influence on the voltage $V_A$ at node A. The "high" at node B is then buffered and inverted by the INVERTING BUFFER 16 so that a "low" at the full voltage level of $-5.0$ V appears at the output $V_{OUT}$. The signal at the output $V_{OUT}$ can, of course, be inverted again by an additional CMOS inverter (not shown) to provide a signal with the same polarity as the ECL signals at the input $V_{IN}$.

When the input signal $V_{IN}$ goes to a logic level "0" at time $T_2$ (FIG. 2), transistor MP2 is still enabled, although the "low" logic level voltage ($-1.6$ volts) applied to the gate of MN1 causes the drain-to-source resistance of MN1 to increase. Thus, through the connection of $V_{DD}$ to node A by the transistor MP2, the voltage at node A rises (to approximately $-2.0$ volts). This voltage at node A appears as a "high" to the INVERTING AMPLIFIER 14, causing the signal ($V_B$) at node B to go to $-4.8$ V, near the full voltage level for a CMOS "low" logic level. As the signal at node B drops, the transistor MP1 becomes enabled, which serves to maintain a stable "high" ($-2.0$ V) at node A.

The "low" at node B is then inverted and buffered to provide a "high" output signal at $V_{OUT}$, which is at the full voltage level for a CMOS "high" (0 V).

It should be appreciated that the conversion of ECL signals to CMOS signals by the converter circuit 10 is done relatively quickly because the transistor MN1 (as well as the transistor MP2) does not switch between enabled and non-enabled conditions in order to follow changes in the logic levels of the ECL signals at the input $V_{IN}$. Rather, the transistor MN1 operates in its linear region, always conducting from its drain to its source. The change in drain-to-source resistance of MN1 which results from the different ECL voltages ($-0.8$ and $-1.6$ V) applied to its gate is, however, sufficient to change the CMOS logic levels at node B and at the output $V_{OUT}$.

Figure 3:
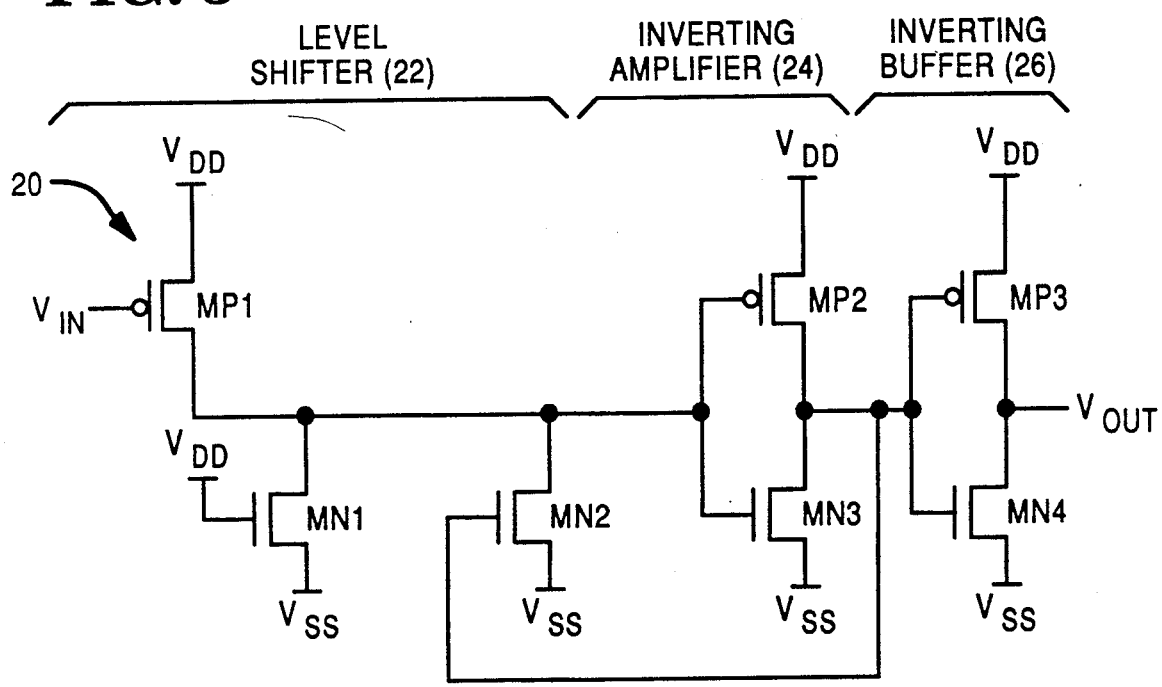
FIG. 3 is a circuit diagram of a converter circuit, illustrating a second embodiment of the present invention.

A second embodiment of the present invention is seen in FIG. 3. In this embodiment, a converter circuit 20 converts input signals at a input $V_{IN}$ from a TTL circuit into signals at an output $V_{OUT}$ for a CMOS circuit. The circuit 20 is constructed similarly to the circuit 10 of FIG. 1, and consists of a LEVEL SHIFTER stage 22, an INVERTING AMPLIFIER stage 24, and an INVERTING BUFFER stage 26.

In the case of a TTL circuit, the "low" logic level is approximately $+0.8$ V and the "high" logic level is approximately $+2.0$ V. Thus, the transistors in the LEVEL SHIFTER 22 must be reversed (as compared to converter circuit 10 in FIG. 1), with the input $V_{IN}$ now connected to the gate of the P-channel transistor MP1 and with the gate of the N-channel transistor MN1 connected to a voltage source $V_{DD}$ (5.0 V). The third transistor in the LEVEL SHIFTER 22 is an N-channel MOS transistor MN2.

The CMOS inverter forming the INVERTING AMPLIFIER 24 thus responds to the change in the drain-to-source resistance of the transistor MP1 (rather than the transistor MN1 as is the case in the converter circuit 10 of FIG. 1) in order to change the logic level of the CMOS signals at the output $V_{OUT}$. The converter circuit 20 otherwise operates similarly to the converter circuit 10.

It can thus be seen that there has been provided by the present invention a converter circuit that converts one set of logic signals into another set of logic signals (in the described embodiments, either ECL or TTL signals are converted into CMOS signals). The conversion is done more quickly than prior circuits because the transistors (MN1 and MP2) at the input of the converter circuit which sense the change in logic level are always enabled. In particular, the transistor MN1 in circuit 10 of FIG.1 and the transistor MP1 in circuit 20 of FIG. 3, which receive the logic signals at the input $V_{IN}$, each operate in their respective linear regions and thus do not need to switch from the enabling condition to the non-enabling condition when the logic level at the input changes. As a consequence, the time required for the circuit 10 and circuit 20 to change logic levels is shorter.

Although the presently preferred embodiments of the invention have been described, it will be understood that various changes may be made within the scope of the appended claims.

What is claimed is:

1. A converter circuit for converting a first set of logic signals into a second set of logic signals, comprising:

a first transistor of a first conductivity type and having first, second and control terminals, with its control terminal connected for receiving the first set of logic signals, and having its first terminal connected to a first voltage source representing a first logic level of the second set of logic signals, each of the first set of logic signals being at a voltage level sufficient to enable said first transistor; and a second transistor of a second conductivity type having first, second and control terminals, with its control terminal connected to said first voltage source and having its first terminal connected to a second voltage source representing a second logic level of the second set of logic signals, said first voltage source being sufficient to enable said second transistor;

the second terminals of said first and second transistors connected to each other for providing signals representing the second set of logic signals.

2. The converter circuit of claim 1, wherein said first set of logic signals are ECL signals and wherein said second set of logic signals are CMOS signals.

3. The converter circuit of claim 2, wherein said first and second transistors are MOS transistors.

4. The converter circuit of claim 2, wherein said first transistor is an N-channel MOS transistor and wherein said second transistor is a P-channel MOS transistor.

5. The converter circuit of claim 4, wherein said first voltage source provides a "low" logic level voltage, and wherein said second voltage source provides a "high" logic level voltage.

6. A converter circuit for converting a set of ECL logic signals into a set of CMOS logic signals, comprising:

a first, N-channel, MOS transistor having first, second and control terminals, having its control terminal connected for receiving said ECL logic signals, and having its first terminal connected to a voltage source providing a "low" CMOS logic level voltage, each of the ECL logic signals being at a voltage level sufficient to enable said N-channel MOS transistor; and a second, P-channel, MOS transistor having first, second and control terminals, having its control terminal connected to a voltage source for enabling said second transistor, and having its first terminal connected to a voltage source providing a "high" CMOS logic level voltage;

wherein the second terminals of said first and second transistors are connected for providing the signals representing the set of CMOS logic signals; and wherein the second terminals of said first and second transistors are connected to the input of a CMOS inverter.

7. The converter circuit of claim 6, wherein the output of said CMOS inverter is connected to the input of a second CMOS inverter, the output of said second CMOS inverter providing the full voltage levels of the second set of logic signals.

8. The converter circuit of claim 1, said first set of logic signals are TTL signals and wherein said second set of logic signals are CMOS signals.

9. The converter circuit of claim 8, wherein said first and second transistors are MOS transistors.

10. The converter circuit of claim 9, wherein said first transistor is a P-channel MOS transistor and wherein said second transistor is an N-channel MOS transistor.

11. A converter circuit for converting a first set of logic signals into a second set of logic signals, comprising:

a first transistor of a first conductivity type and having a first, second and control terminals, with its control terminal connected for receiving the first set of logic signals; and a second transistor of a second conductivity type having first, second and control terminals, with its control terminal connected to a first voltage source representing a first logic level of the second set of logic signals for enabling said second transistor;

the first terminal of said first transistor connected to said first voltage source and the first terminal of said second transistor connected to a second voltage source representing a second logic level of the second set of logic signals, the second terminals or said first and second transistors connected for providing a signal representing the logic levels of the second set of logic signals, with said first transistor operating in its linear region when receiving the first set of logic signals.

* * * * *